(12) United States Patent
Brown

(10) Patent No.: US 6,586,800 B2
(45) Date of Patent: Jul. 1, 2003

(54) TRENCH-GATE SEMICONDUCTOR DEVICES

(75) Inventor: Adam R. Brown, Bramhall (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 70 days.

(21) Appl. No.: 09/854,395

(22) Filed: May 11, 2001

(65) Prior Publication Data

US 2001/0041407 A1 Nov. 15, 2001

(30) Foreign Application Priority Data

May 13, 2000 (GB) ............................................. 0011495
Dec. 12, 2000 (GB) ............................................. 0030225

(51) Int. Cl.⁷ ......................... H01L 31/62; H01L 31/113
(52) U.S. Cl. ...................... 257/330; 257/331; 257/332; 438/270; 438/271
(58) Field of Search ................. 257/330, 331, 257/332, 333, 334, 335, 336; 438/270, 271

(56) References Cited

U.S. PATENT DOCUMENTS

| | | | |
|---|---|---|---|
| 5,581,100 A | 12/1996 | Ajit | 257/331 |
| 5,656,843 A | 8/1997 | Goodyear et al. | 257/329 |
| 5,895,951 A | 4/1999 | So et al. | 257/330 |
| 6,005,272 A | * 12/1999 | Gardner et al. | 257/344 |

OTHER PUBLICATIONS

Patents Abstracts of Japan, vol. 1997, No. 02, Feb. 28, 1997, JP 08264772A (Toyota Motor Corp), Oct. 11, 1996, Abstract; Paragraphs 0030–0039; Figures 5, 8, 9.

* cited by examiner

Primary Examiner—Kamand Cuneo
Assistant Examiner—Lisa Kilday
(74) Attorney, Agent, or Firm—Steven R. Biren

(57) ABSTRACT

A trench-gate MOSFET or ACCUFET has its gate (21) in a first trench (20) that extends through a channel-accommodating body region (15) to a drain region (14). Within the transistor cells, a second trench (40) comprising deposited highly-doped semiconductor material (41) extends to the drain region (14). This highly-doped material (41) is of opposite conductivity type to the drain region (14) and, together with a possible out-diffusion profile (42), forms a localized region (41, 42) that is separated from the first trench (20) by the body region 15. A source electrode (23) contacts the source region (13) and the whole top area of the localized region (41, 42). In a MOSFET, the localized region (41, 42) provides protection against turning on of the cell's parasitic bipolar transistor. In an ACCUFET (FIG. 9), the localized region (41, 42) depletes the channel-accommodating body region (15A). In both devices the localized region (41, 42) is well-defined and can be narrow to enable a small transistor cell size. Furthermore, before filling the second trench (40) with its semiconductor material (41), the drain region (14) can be readily provided with an avalanche-breakdown region (64) at the bottom of the second trench (40), for example by implanting dopant ions (60) of the same conductivity type as the drain region (14). This avalanche-breakdown region (64) improves the ruggedness of the device. It can also aid current spreading (66) in the drain region (14) in the conductive state of the transistor.

14 Claims, 5 Drawing Sheets

TRENCH-GATE SEMICONDUCTOR DEVICES

This invention relates to trench-gate semiconductor devices, for example power transistors, and to methods of manufacturing such devices.

Trench-gate semiconductor devices are known that comprise a semiconductor body having a plurality of transistor cells, wherein each transistor cell is surrounded by a trench-gate comprising a first trench extending into the semiconductor body with gate material in the trench and with an insulating overlayer on top of the gate material. Each transistor cell has an annular source region of a first conductivity type adjacent to the trench-gate, a channel-accommodating body region adjacent to the trench-gate under the source region, and a drain region of the first conductivity type adjacent to the trench-gate under the channel-accommodating body region. At least some of the transistor cells have a localised region of a second conductivity type, opposite to the first conductivity type, which is of higher conductivity than the channel-accommodating region, the localised region extending into the semiconductor body to the drain region and being separated from the trench-gate first trench by the channel-accommodating body region. A source electrode extends over said insulating overlayers and contacts the source regions and the localised regions.

The usual trench-gate semiconductor device of this known kind has a channel-accommodating body region in each transistor cell of the second conductivity type, opposite to that of the source and drain regions. One example is a vertical structure insulated-gate field-effect power transistor (commonly termed a "MOSFET") in which the above-defined drain region is a high resistivity drain-drift region on a high conductivity substrate region of the same (first) conductivity type. Another example is vertical structure insulated-gate bipolar power transistor (commonly termed an "IGBT") in which the above-defined drain region is a high resistivity drain-drift region on a high conductivity substrate region of the opposite (second) conductivity type. In a MOSFET or an IGBT as just described, the source, body and drain regions constitute a built-in parasitic bipolar transistor. Incidental turning on of this parasitc bipolar transistor may cause permanent damage to the trench-gate transistor cell and hence to the trench-gate device. The function of the above-defined localised region in these devices is to provide device ruggedness, that is to protect each cell having such a region against turning on of the parasitic bipolar transistor by having an avalanche diode current path from the drain region through the localised region to the source electrode.

A less usual trench-gate semiconductor device of said known kind is an accumulation-mode device, which has a channel-accommodating body region in each transistor cell of the game first conductivity type as the source and drain regions. In an insulated-gate such device (commonly termed an "ACCUFET"), the conductive channel induced by the trench-gate in the on-state is formed by charge-carrier accumulation. The function of the above-defined localised region in this device is to provide a depletion layer in the body region in the off-state which, together with a depletion layer from the insulated trench-gate may wholly deplete the channel-accommodating body region.

Conventional localised regions for both MOSFETS and ACCUFETS have dopant of the second conductivity type which is implanted from the semiconductor body top major surface and diffused to extend to the drain region. For a MOSFET the localised region preferably extends to below the depth of the surrounding trench-gate trench. A disadvantage of this conventional localised region is that vertical diffusion to the required depth of the localised region is necessarily accompanied by lateral diffusion, and the size of the transistor cell must be sufficiently large to ensure separation of the localised region from the surrounding trench-gate trench. It is desirable to have the transistor cell size small so that the trench-gate device hat high cell density and low specific resistance. Reduction of cell size is limited by the laterally diffused portion of this conventional localised region.

The disadvantage of conventionally formed localised regions as described above is recognised, for MOSFET transistors, in U.S. Pat. No. 5,895,951 (So et al). The whole contents of U.S. Pat. No. 5,895,951 are hereby incorporated herein as reference material. So et al proposes providing, within a vertical MOSFET cell, a deep trench having an insulating layer within the otherwise open trench, implanting dopant ions into the semiconductor body through the insulating layer in the trench, diffusing this implanted dopant into the semiconductor body, and filling the trench. The diffused dopant which has been implanted through the open trench forms the above-discussed localised region. Particular disadvantages of the So et al proposal are as follows. The high temperature diffusion anneals the implant damage and ensures that the implanted region meets up with body region of the transistor cell. However this diffusion limits how narrow the total trench plus implanted and diffused localised region can be. An added difficulty with the implantation process is that the deeper the trench the more it collimates the implanting beam, so that less of the dopant will tend to be implanted in the lower walls and bottom corners of the trench requiring extra diffusion to make up for this reduced implantation. Apart from these difficulties, since the localised region consists only of the comparatively narrow implanted and diffused dopant region outside the trench there will be a comparatively high electrical resistance of this localized region between where it contacts the source electrode and where it is under the bottom of the trench, whereas this path should have low electrical resistance to stop the parasitic bipolar transistor turning on.

An object of the present invention is to provide a trench-gate semiconductor device, and methods of manufacturing such a device, which device and methods overcome the above-discussed disadvantage of the conventional localised region while also avoiding the above-discussed disadvantages and difficulties associated with the U.S. Pat. No. 5,895,951 (So et al) proposal.

According to the present invention there is provided a trench-gate semiconductor device of the above-described kind, but that is characterised in that each said localised region comprises deposited semiconductor material of the second conductivity type which fills a second trench extending into the semiconductor body, with the source electrode contacting said localised region on the whole top area of the second trench. Such a device may have the features set out in claim 1. It may also have one or more of the advantageous preferred features set out in any one of claims 2 to 14.

Every transistor cell of the device may have such a localised region comprising the deposited semiconductor material of the second conductivity type. Preferably each said localised region includes an out-diffused region extending from the side and bottom of the respective second trench, the out-diffused region having a diffusion profile of dopant from the deposited semiconductor material which fills the respective second trench.

The deposited high conductivity semiconductor material in the second trench, in accordance with the present invention, enables a well-defined sufficiently deep and narrow localised region for attaining a small size transistor cell. Where the device is a MOSFET, contact between the source electrode and the deposited semiconductor material on the whole top area of the second trench achieves the desired low electrical resistance path to the bottom of the second trench to stop the parasitic bipolar transistor turning on.

Where the localised region includes an out-diffused region of the deposited semiconductor material dopant extending from the side and bottom of the second trench, then this out-diffused region will extend a uniform distance from the second trench. Such uniform doping control is advantageous where the device is an ACCUFET in order to achieve an accurately defined depletion layer in the body region from the localised region. Where the device is a MOSFET, the localised region preferably extends slightly deeper than the surrounding trench-gate trench. Thus, if the second trench containing deposited semiconductor material extends to the same depth as the surrounding trench-gate trench, then this uniform doping control will require only a small thermal budget to out-diffuse dopant from the second trench to a small distance below the bottom of that trench. The corresponding small distance lateral out-diffusion from the second trench is advantageous for achieving a small size transistor cell.

A further advantage of having the deposited high conductivity semiconductor material filling the second trench is that, where the device is a MOSFET, if under reverse bias the body region of the transistor cell becomes fully depleted, then this depletion region enters the semiconductor material in the second trench and there is no logo of the breakdown capability of the localised region, that is the protection against turning on of the parasitic bipolar transistor.

A further advantage of the characterising structure of the localised region of the device according to the present invention is that it lends itself to the possibility of the annular source region extending laterally from the trench-gate trench to adjacent the localised region. Thus the second trench may define the lateral extent of the source region and provide a particularly compact cell geometry and small transistor cell size.

Yet another advantage is that the drain region can be readily provided with an avalanche-breakdown region at the bottom of the second trench, that renders the device more capable of withstanding avalanche events. This improves the so-called "ruggedness" of the device, i.e. its capability of absorbing energy surges without being destroyed. The avalanche-breakdown region is of the first conductivity type, forms a p-n junction with the localised region at the bottom of the second trench, and has a higher doping concentration than the adjacent portion of the drain region. This region determines a well-defined avalanche breakdown voltage for the p-n junction with the localised region. The concept is an extension of the advantageous device structure already disclosed in U.S. Pat. No. 5,656,843 the whole contents of which are hereby incorporated herein as reference material.

This avalanche-breakdown region can be readily incorporated in a device in accordance with the present invention. Thus, before filling the second trenches with the deposited material of the second conductivity type, dopant ions of the first conductivity type can be implanted in the drain region at the bottom of the second trench for providing this region. Furthermore, the depth of the second trench can be chosen such that this avalanche-breakdown region can readily be located deeper in the drain region than the depth of the trench-gate (first trench). This deeper region then also aids current spreading in the drain region.

Semiconductor devices in accordance with the invention can be manufactured using several advantageous methods.

In a first preferred method of manufacturing a semiconductor device, which device is in accordance with the invention, the method includes the steps of:

(a) simultaneously forming all of said first trenches and afterwards providing said gate material in said first trenches; and then later (b) simultaneously forming all of said second trenches and afterwards filling said second trenches with said deposited semiconductor material of the second conductivity type. In this method:

a layer of insulating material may be provided on the semiconductor body and on the gate material after step (a), and windows then provided in the insulating material;

the formation of said second trenches as in step (b) may be performed by etching through said windows;

said windows may be enlarged after step (b) to expose said source regions while leaving the insulating material to provide said insulating overlayers on top of the gate material; and then said source electrode may be provided in said enlarged windows and on said insulating overlayers.

An advantage of this method is that it can be integrated into a conventional method of manufacturing a trench-gate semiconductor device in which the trench-gates and source regions are formed first, and then contact windows for the source electrode are opened in an insulating layer which is left to provide an insulating overlayer on each trench-gate. Thus, in this preferred method in accordance with the invention, the localised regions may be produced after the trench-gates and source regions have been formed, that is they may be produced using the insulating layer in which the source electrode contact windows will be formed.

In a second preferred method of manufacturing a semiconductor device, which device is in accordance with the invention, the method includes the steps of:

(a) simultaneously forming all of said first and second trenches;

(b) providing said gate material in said first trenches; and (c) filling said second trenches with said deposited semiconductor material of the second conductivity type.

In this method, the first and second trenches may be filled with insulating material after step (a), this insulating material then being masked on one set of trenches and removed from the other set of trenches for performing step (b) or step (c).

An advantage of this second preferred method is that simultaneously forming the first and second trenches ensures that, notwithstanding unavoidable variation in trench depth cut across a wafer, each second trench for a localised region will have a depth which is substantially identical with the depth of the first trench for the trench-gate which surrounds that second trench, Thus, in the preferred case where each localised region is to extend slightly deeper than the surrounding trench-gate trench, this can be reliably achieved by diffusing dopant from the deposited semiconductor material out of the second trenches for only a small distance requiring only a small thermal budget for this diffusion.

Embodiments of the present invention will now be described, by way of example, with reference to the accompanying diagrammatic drawings, in which.

Figure 1:
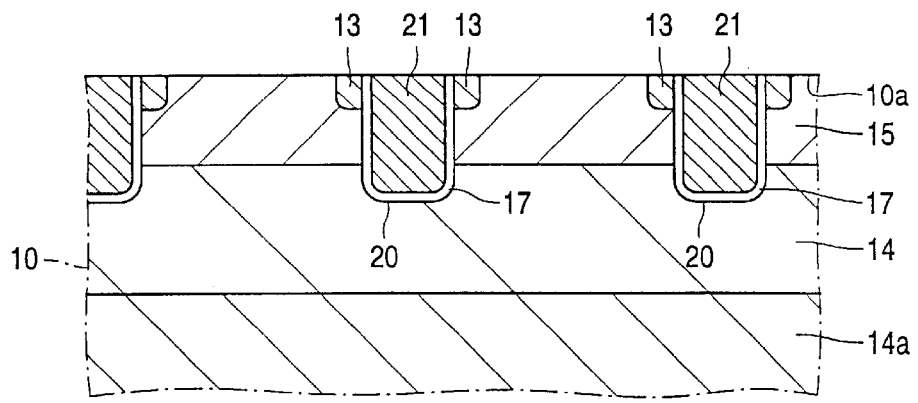
FIGS. 1 to 3 are a cross-sectional view of transistor cell areas of a semiconductor body at successive stages in the manufacture of a trench-gate MOSFET semiconductor device in accordance with the present invention by a first example of a method in accordance with the invention.
Figure 2:
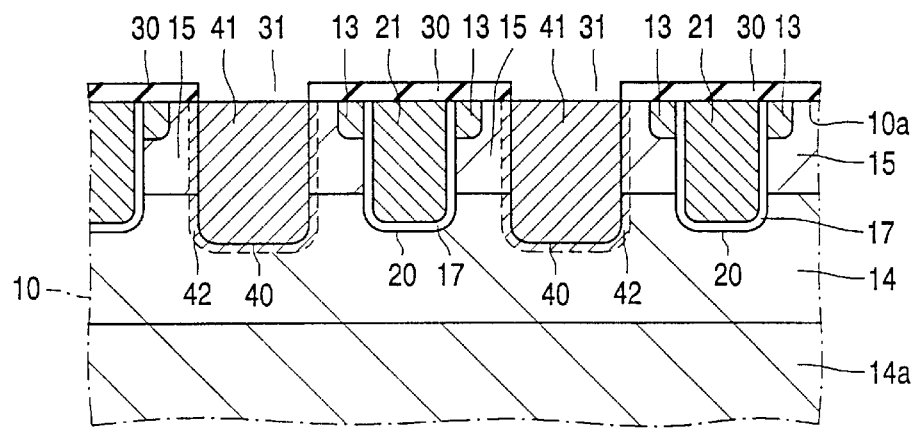
Figure 3:
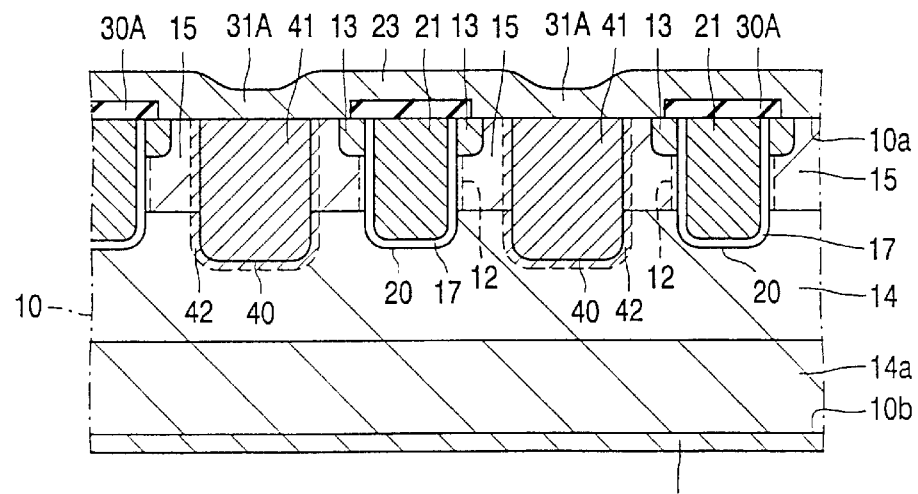
Figure 10:
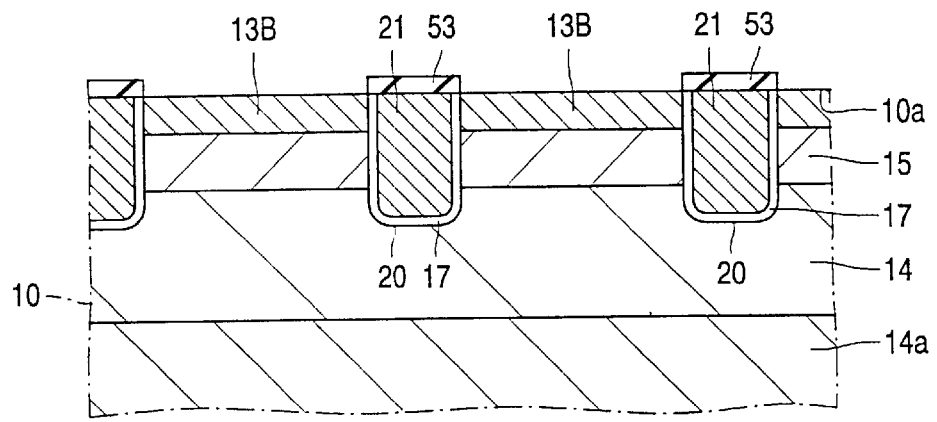
Figure 11:
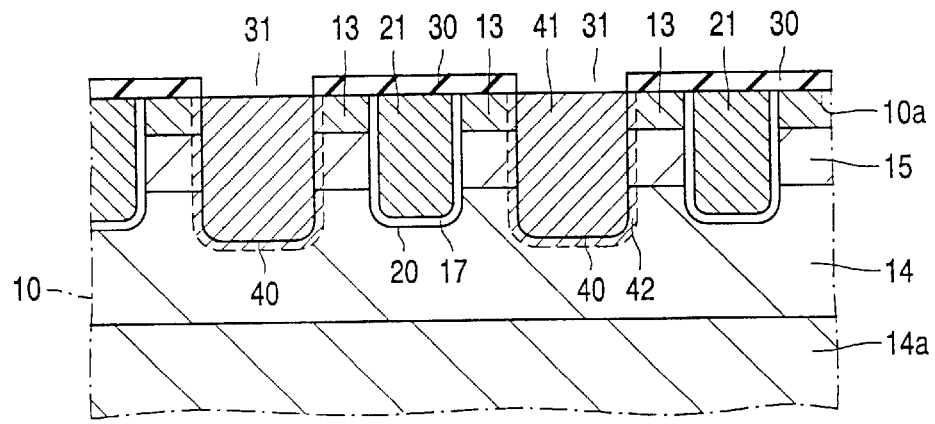
Figure 12:
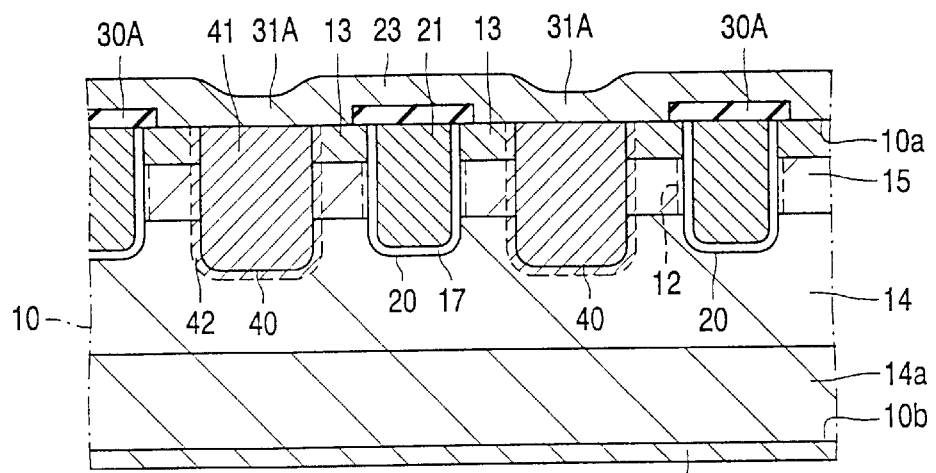
Figure 13:
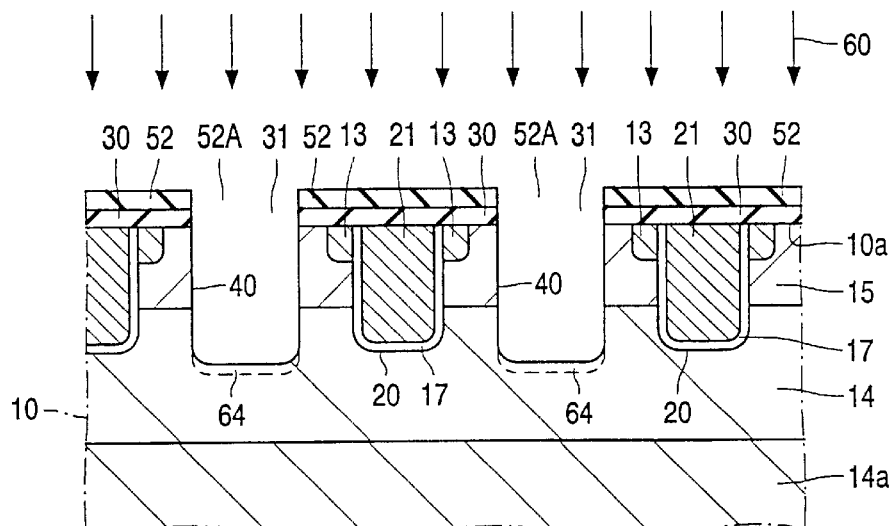
Figure 14:
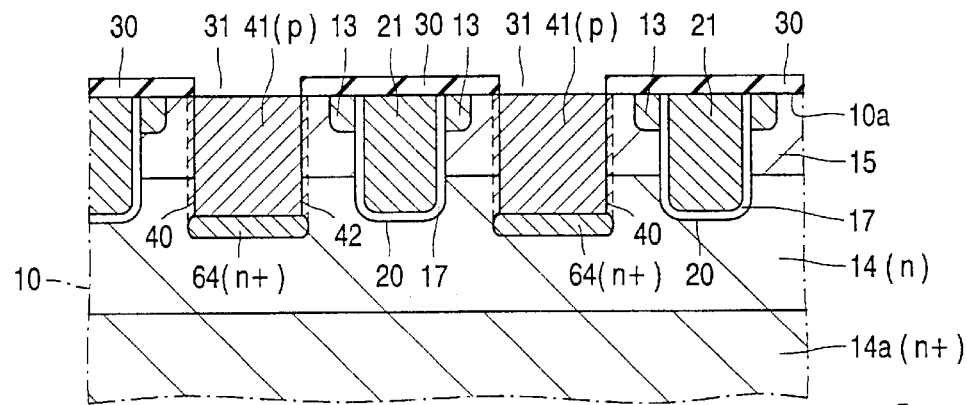
Figure 15:
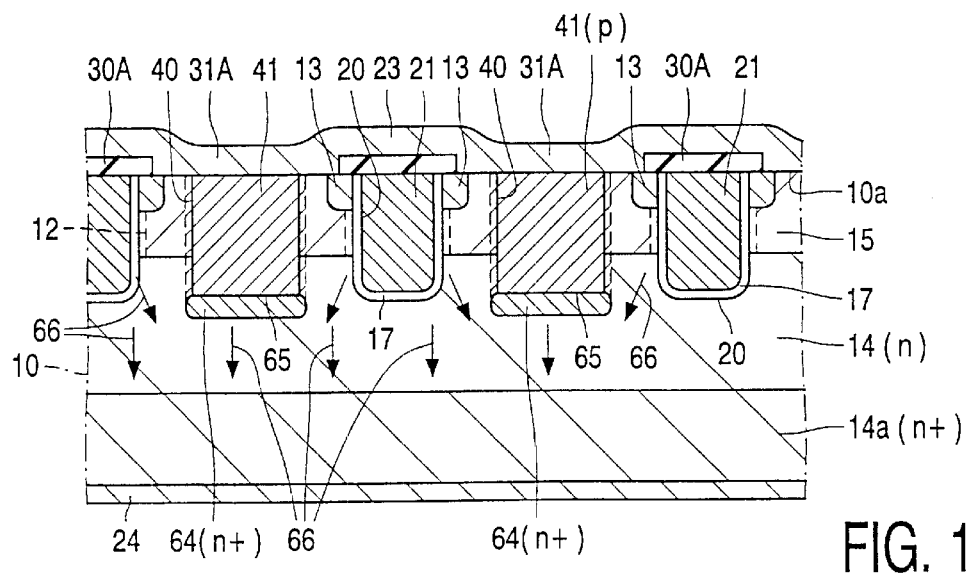

FIGS. 10 to 12 are a cross-sectional view of transistor cell areas showing manufacturing stages modified with respect to FIGS. 1 to 3 to produce a MOSFET with more compact transistor cells than the MOSFET shown in FIG. 3; and FIGS. 13 to 15 are a cross-sectional view of transistor cells showing manufacturing stages and the resulting device structure, modified to incorporate an avalance-breakdown region for providing the device with a good ruggedness capability.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in different stages of manufacture and in modified and different embodiments.

FIG. 3 illustrates an exemplary embodiment of a power semiconductor device having a plurality of transistor cells where each transistor cell is surrounded by a trench-gate having a first trench 20 with gate material 21 in the trench 20 and an insulating overlayer 30A on top of the gate material 21. Each transistor cell has an annular source region 13 of a first conductivity type (n-type in this example) adjacent to the gate 21, a channel-accommodating body region 15 of the opposite conductivity type (i.e. p-type in this example) adjacent to the gate 21 under the source region 13, and a drain region 14 of the first conductivity type adjacent to the gate 21 under the channel-accommodating body region 15. The application of a voltage signal to the gate 21 in the on-state of the device serves in known manner for inducing a conduction channel 12 in the region 15 and for controlling current flow in this conduction channel 12 between the source and drain regions 13 and 14.

The source region 13 and the body region 15 of each transistor cell are contacted by a source electrode 23 at the top major surface 10a of the device body. By way of example, FIG. 3 shows a vertical structure in which the region 14 may be a drain-drift region formed by an epitaxial layer of high resistivity (low doping) on a substrate region 14a of high conductivity. This substrate region 14a may be of the same conductivity type (n-type in this example) as the region 14 to provide a vertical MOSFET, or it may be of opposite conductivity type (p-type in this example) to provide a vertical IGBT. The substrate region 14a is contacted at the bottom major surface 10b of the device body by an electrode 24, called the drain electrode in the case of a MOSFET and called the anode electrode in the case of an IGBT.

Within each transistor cell there is a second trench 40. Deposited semiconductor material 41 of the second conductivity type p-type in this example) which is of higher conductivity than the body region 15 fills the second trench 40. An out-diffused region 42 having a diffusion profile of dopant from the semiconductor material 41 extends from the side and bottom of the trench 40. The deposited material 41 and the out-diffused region 42 together provide a localised region extending into the semiconductor body to the drain region 14 and separated from the trench-gate first trench 20 by the channel-accommodating body region 15. The source electrode 23 contacts the localised region 41, 42 on its top area including the whole top area of the second trench 40. The source 13, body 15 and drain region 14 of each transistor cell constitute a built-in parasitic bipolar transistor, and the function of the localised region 41, 42 is to provide device ruggedness, that is to protect the transistor cell against incidental device damaging turning on of the parasitic bipolar transistor, by having an avalanche diode low electrical resistance current path from the drain region 14 through the localised region 41, 42 to the source electrode 23.

No plan view of the cellular layout geometry of the device transistor cells is shown in the drawings, because the methods and devices of FIGS. 1 to 12 may be for quite different, known cell geometries. Thus, for example the cells may have a square geometry, or they may have a close-packed hexagonal geometry or an elongate stripe geometry. In each case, the trench 20 (with its gate 21) extends around the boundary of each cell. FIG. 3 shows only a few cells, but typically the device comprises many hundreds of these parallel cells between the electrodes 23 and 24. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

Successive stages in the fabrication of the transistor cells of FIG. 3 will now be described with reference to FIGS. 1 to 3.

Referring to FIG. 1, a semiconductor body 10 of monocrystalline silicon material is first provided having a substrate region 14a of high conductivity on which there is formed an epitaxial high resistivity (low-doped) n-type first layer 14 suitable for the drain drift region, and an epitaxial p-type second layer 15 on top of the first layer 14 and extending to a top major surface 10a of the semiconductor body 10. The layer 15 is suitable for the channel-accommodating body regions. The layer 15 may alternatively be formed by introducing suitable dopant into the layer 14, for example by implantation of boron dopant ions followed by heating to diffuse the dopant to the desired depth for the layer 15.

One possible method of proceeding from the layered structure 14, 14a, 15 to the structure of FIG. 1 is as follows. A network of trenches 20 containing gate material 21 is first formed in an active cell area of the semiconductor body 10. The trenches 20 extend past the second layer 15 into an underlying portion of the first layer 14. To form the trenches, a mask (not shown) is first provided at the surface 10a of the semiconductor body 10. This mask can be formed by depositing silicon dioxide material and subsequently opening windows using known photolithographic and etching techniques. A silicon-etching treatment is then carried out in known manner to etch the trenches 20 into the silicon body 10 at the windows in the mask. The layout pattern of the trenches 20 is a grid surrounding isolated hexagonal areas. The width of the etched trenches 20 may be, for example, in the range of 0.5 μm to 1.0 μm. The silicon body 10 and the oxide mask are then subjected to an oxidation treatment to grow a thin silicon dioxide layer on the exposed faces of the trenches 20 which provides a gate insulating layer 17 in the trenches. Doped polycrystalline silicon gate material 21 is then deposited in the trenches 20 and on the top surface of the oxide mask. The deposited polycrystalline silicon gate material 21 is then etched back so that its top surface is planarised level with the surface 10a of the silicon body 10, and the oxide mask is then removed from the surface 10a of the silicon body 10. N-type source regions 13 extending into the layer 15 are then formed. For this purpose a mask (not shown) is formed by depositing a continuous layer of resist material on the silicon body and then forming windows in this layer in a standard manner using photolithography and etching. These windows have an annular shape in the hexagonal transistor cell areas surrounded by the trenches 20. An implantation of donor ions (for example of phosphorous or arsenic) is then carried out to form implanted regions in the layer 15 at the windows in the resist mask, followed by a heating treatment for annealing and diffusing these donor implant regions. The n-type implanted and diffused regions form transistor cell source regions 13 and the underlying layer 15 provides channel-accommodating body regions.

Another possible method of proceeding from the layered structure 14, 14a, 15 to the structure of FIG. 1 is as follows. A mask (not shown), for example of silicon nitride material, is provided at the body surface 10a. This mask may be formed in a standard manner using photolithography and etching. First a continuous layer of the mask material is formed by deposition. The mask pattern is then defined on the mask layer by forming a photoresist pattern having windows, and subsequently etching away the mask layer where exposed at the windows. The silicon nitride mask is, for example, a pattern of hexagonal dot pillars if an hexagonal geometry device is being manufactured. In this case, the windows form an hexagonal grid pattern and may be, for example 0.5 μm to 1.0 μm in width. An implantation of donor ions (for example of phosphorous or arsenic) is then carried out to form implanted n-type regions in the body region 15 at the windows in the nitride mask. A heating treatment for annealing and diffusing this donor implant is then carried out. The diffusion is such that the resulting n-type regions extend laterally below the nitride mask. These diffused n-type regions form an hexagonal grid pattern in the case of hexagonal geometry cells. In a typical example, the heating may be carried out for a sufficient time to diffuse the implanted dopant over a lateral distance of 0.1 μm to 0.5 μm. A silicon-etching treatment is then carried out in known manner, using the silicon nitride mask as an etchant mask, to etch the trenches 20 into the silicon body 10 through the laterally extending n-type diffused regions at the windows in the silicon nitride mask. The layout pattern of the trenches 20 is an hexagonal grid when an hexagonal geometry device is being manufactured. The remaining portions of the laterally extending n-type regions that adjoin the trenches 20 form the source regions 13 of the transistor cells. The lateral extent of the source regions 13 is determined by the extent to which the trench etching extends under the silicon nitride mask. This can be well-controlled using a anisotropic plasma etching for at least most of the depth of the trenches 20. However, it can be advantageous to use a final brief isotropic etch in order to round the bottom corners of the trenches 20. The width of the etched trenches 20 may be, for example, in the range of 0.5 μm to 1.0 μm. The silicon body 10 is then subjected to an oxidation treatment to form a thin silicon dioxide layer 17 on the exposed faces of the trenches 20. During this stage, the silicon nitride mask serves to mask the silicon surface 10a against oxidation. Doped polycrystalline silicon is then deposited in known manner in the windows and on the nitride mask. This deposited polycrystalline silicon is then etched back until, using the nitride mask as an etchant mask, the polycrystalline silicon material is left only in the trenches 20 where it is to form the gates 21. The silicon nitride mask is then removed from the surface 10a by etching.

Referring now to FIG. 2, a layer 30 of insulating material, suitably silicon dioxide, is provided on the semiconductor body 10 having the structure of FIG. 1. The silicon dioxide layer 30 may be formed, for example, using decomposition of vapourised liquid tetraethyl orthosilicate (TEOS). Using photolithography and etching, windows 31 are then provided in the insulating layer 30. The windows 31 have a hexagonal shape and are centrally disposed in the hexagonal transistor cell areas surrounded by the trenches 20. A silicon-etching treatment is then carried out in known manner to etch trenches 40 into the silicon body 10 at the windows 31. The width of the etched trenches 40 may be, for example, in the range of 0.5 μm to 1.0 μm. Typically envisaged is a transistor cell pitch of 3 μm with the trenches 20 and the trenches 40 having similar width dimensions of 1 μm. The depth of the trench-gate trenches 20 is typically 2 μm and, for a MOSFET, the trenches 40 should have at least the same depth as the trenches 20. FIG. 2 shows the trenches 40 etched slightly deeper than the trenches 20 to take account of unavoidable variation in trench depth cut across a wafer. Deposited p-type semiconductor material 41, which is of higher conductivity than the body regions 15, is then provided to fill the trenches 40. The material 41 may be polycrystalline silicon which is in-situ doped with boron and deposited in the trenches 40 and on top of the insulating layer 30. The deposited polycrystalline silicon 41 is then etched back so that its top surface is planarised level with the surface 10a of the silicon body 10. The material 41 may alternatively be boron doped selectively grown epitaxial (SEG) silicon. In this SEG process, the doped epitaxial silicon grows in the etched silicon trenches 40; it may not deposit on the insulating layer 30 at all, or it may deposit on the layer 30 as polycrystalline or amorphous material which is then etched away to leave the epitaxial silicon 41 in the trenches 40 level with the surface 10a of the silicon body 10.

After filling the trenches 40 with the deposited p-type semiconductor material 41, dopant from the material 41 is diffused out of the trenches 40. The out-diffused region 42 having a diffusion profile of p-type dopant from the material 41 will extend a uniform distance from the side and bottom of the trenches 40. The deposited material 41 and the out-diffused region 42 together provide a localised region in each transistor cell extending into the semiconductor body 10 to the drain region 14 and separated from the surrounding trench-gate trench 90 by the channel-accommodating body region 15. The uniform doping control for the out-diffused region 42 ensures that the out-diffusion need only be for a small distance from the trenches 40, typically no more than about 0.2 μm, requiring only a small thermal budget for this diffusion. Thus, for example, ten seconds at 1000° C. in a rapid thermal anneal (RTA) machine or thirty minutes at 850° C. in a standard furnace may be sufficient for this out-diffusion.

The deposited semiconductor material 41 must be of opposite conductivity typo (p-type in this example) to the drain region 14 so that the localised region 41, 42 in each transistor cell performs its (ruggedness) protection function for that cell. Preferably the surrounding trench-gate Z for each cell has opposite conductivity to that of the localised region 41, 42. Thus the doped polycrystalline silicon described above with reference to FIG. 1 as providing the gate material 21 is preferably of n-type conductivity in this example.

Referring now to FIG. 3, the windows 31 in the silicon dioxide insulating layer 30, which were used to etch the trenches 40 as described above, are enlarged by masking the layer 30 and etching to form contact windows 31A with the source regions 13 exposed at the surface 10a of the silicon body 10 while leaving the silicon dioxide to provide insulating overlayers 30A on top of the gate material 21 in the trenches 20. Electrode material (for example aluminium) is now deposited to provide the source electrode 23 in contact with the exposed silicon surface 10a of the regions 13 and 15 and in contact with the whole top surface area of the localised regions 41, 42. The lateral extent of the source electrode 23 is determined in known manner by photolithographic definition and etching of the deposited electrode material. As illustrated in FIG. 3, the source electrode 23 also extends on the insulating overlayers 30A over the trench-gates 21.

Successive stages in the fabrication of a device similar in most respects to that shown in FIG. 3, by an alternative method to that described above with reference to FIGS. 1 to 3, will now be described with reference to stages shown in FIGS. 4 to 7, these stages being followed by stages similar to those shown in FIGS. 2 and 3.

Figure 4:
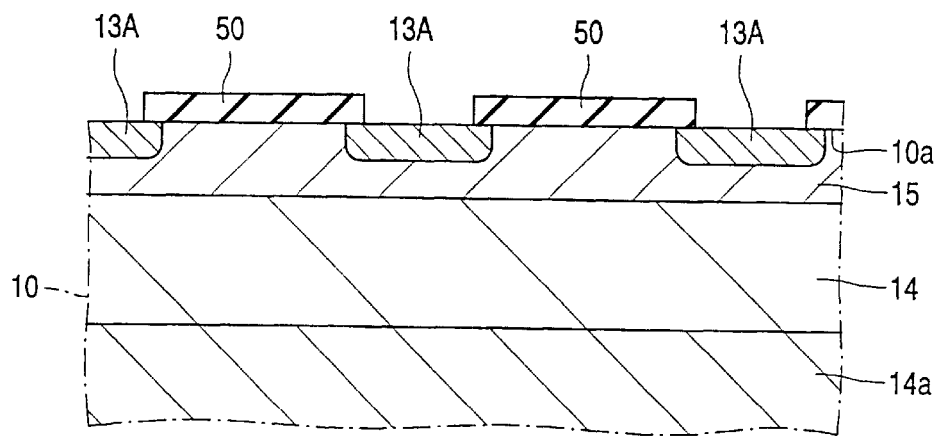
FIGS. 4 to 7 are a cross-sectional view of transistor cell areas of a semiconductor body at successive stages in the manufacture of a trench-gate MOSFET similar in most respects to the MOSFET shown in FIG. 3, by a second example of a method in accordance with the invention in which these stages are followed by stages similar to those shown in FIGS. 2 and 3.

Referring now to FIG. 4, there is shown the same layered structured 14, 14a, 15 which is first provided as has been described above with reference to FIG. 1. The second possible method of proceeding from the layered structure 14, 14a, 15 described above with reference to FIG. 1 included providing a silicon nitride mask at the body surface 10a, implanting donor ions in the region 15 at windows in the nitride mask and then diffusing the donor implant to form n-type regions which extend laterally below the nitride mask. This process can be used to form the structure shown in FIG. 4 which shows the silicon nitride mask 50 and the implanted and diffused n-type regions 13A.

Figure 5:
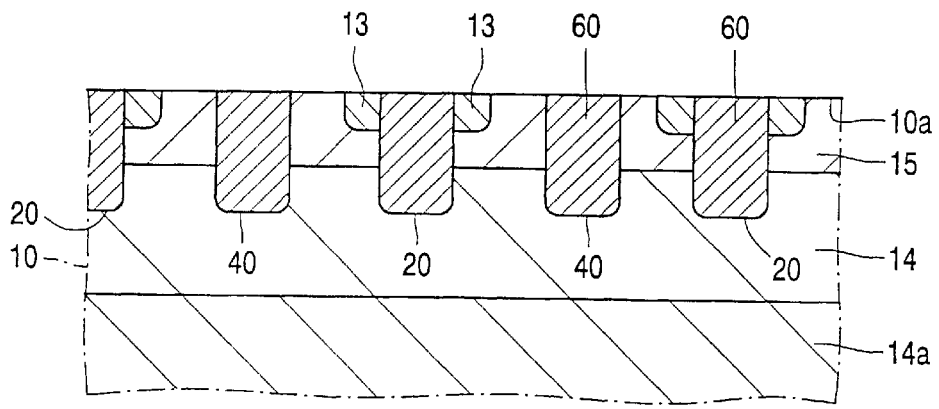

Referring now to FIG. 5, the nitride mask 50 shown in FIG. 4 is first removed by etching. A mask (not shown) is then provided at the surface 10a of the semiconductor body 10. This mask may suitably be of tetraethyl orthosilicate (TEOS) decomposed silicon dioxide as described above for the layer 30 shown in FIG. 2. In this case, however, the mask is provided with windows through which etching into the silicon body 10 simultaneously forms all the trenches 20 where the trench-gates will be provided and all the trenches 40 where the localised regions will be provided. In etching the trenches 20 and 40, the remaining portions of the laterally extending n-type regions 13A that adjoin the trenches 20 form the source regions 13 of the transistor cells. The trenches 20 and 40 are then filled with insulating material 60, which may suitably be TEOS decomposed silicon dioxide deposited in the trenches 20 and 40 and then planarised level with the surface 10a of the body 10. The silicon dioxide mask used to etch the trenches 20 and 40 may be removed before depositing the material 60 in the trenches and on the top surface of the body 10 before planarising. Alternatively the silicon dioxide material 60 may be deposited in the trenches and on the silicon dioxide mask before planarising both the material 60 and the mask level with the surface 10a.

Figure 6:
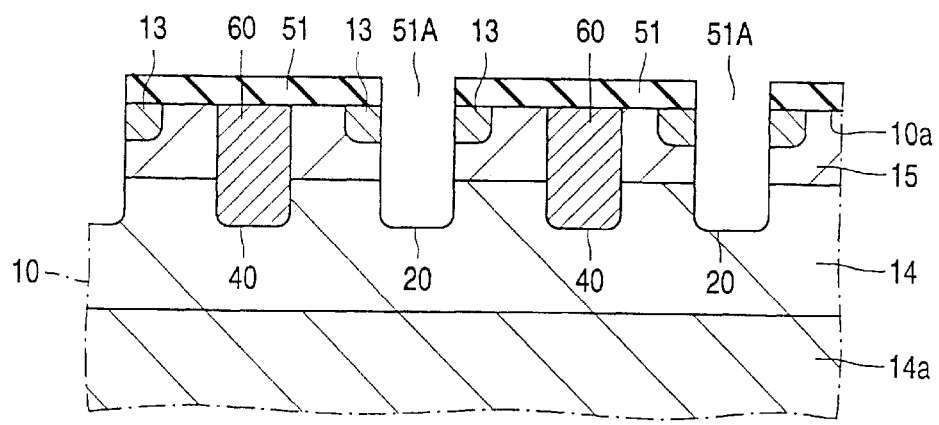

Referring now to FIG. 6, a mask 51, suitably of silicon nitride material, is provided over the silicon body 10 on the surface 10a. The mask 51 is over the insulating material 60 in the trenches 40 and the source regions 13, and has windows 51A over the trenches 20. The insulating silicon dioxide material 60 is then removed from the trenches 20 by etching using the mask 51. It may be noted that the mask 51 has the same geometry as the mask 50 shown in FIG. 4 which was used for forming the n-type regions 13A. The same photolithographic mask and resist pattern which was used to form the nitride mask 50 may therefore be used to form the nitride mask 51.

Figure 7:
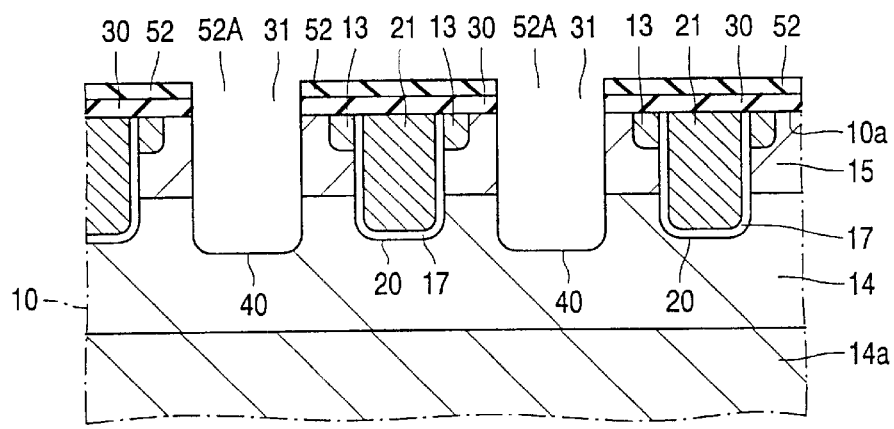

Referring now to FIG. 7, the silicon nitride mask 51 shown in FIG. 6 is used, in the same manner as has been described above in relation to the second possible method of providing the structure of FIG. 1, for providing a thin silicon dioxide layer 17 on the exposed faces of the trenches 20 and then for providing doped polycrystalline silicon gate material 21 in the trenches 20. The mask 51 is then removed and then a new layer 30 of the same TEOS decomposed silicon dioxide insulating material as that which fills the trenches 40 (see FIG. 6) is provided over this material 60 in the trenches 40, over the gate material 21 and over the silicon body 10 at the surface 10a. An etchant mask 52, suitably of silicon nitride material having windows 52A over the locations of the trenches 40 is then provided on the new silicon dioxide layer 30 over the semiconductor body 10 and over the gate material 21 filled trenches 20, the insulating material 60 is removed from the trenches 40 using the mask 52 and the new layer of silicon dioxide 30 is left with windows 31 over the trenches 40. The mask 52 is then removed.

Deposited p-type semiconductor material 41 (see FIG. 2) is then provided to fill the trenches 40 level with the surface 10a of the silicon body 10 and dopant from this material is then diffused out of the trenches 40. These process steps and the resulting structure are similar to the corresponding steps and structure described above with reference to FIG. 2. The difference is that simultaneous etching of the trenches 20 and 40 as has been described with reference to FIG. 5 ensures that, notwithstanding unavoidable variation in trench depth cut across a wafer, each trench 40 will have a depth which is substantially identical with the depth of the trench-gate trench 20 which surrounds that trench 40. Thus the thermal budget to form the out-diffused region 42 (see FIG. 2) is possibly even smaller than that described with reference to FIG. 2 with the out-diffusion distance to ensure that each localized region 41, 42 extends to below the depth of the surrounding trench-gate trench 20 also being possibly even smaller, for example as small as approximately 0.1 $\mu$m.

Referring now to FIG. 3, the structure of FIG. 2 which has been produced as described above by the stages including those shown in FIGS. 4 to 7 then has the windows 31 enlarged to form contact windows 31A and a source electrode 23 formed to provide a device similar to that shown in FIG. 3. The essential features involved in the method including the stages shown in FIGS. 4 to 7 are that the trenches 20 and 40 are formed simultaneously, followed by providing gate material 21 in the trenches 20 and providing deposited semiconductor material 41 in the trenches 40. It is envisaged that there can be variations in the other details of this described method. For example, starting from the structure shown in FIG. 6, the mask 51 can be removed, then the silicon dioxide layer 17 is provided in the trenches 20 and on the surface 10a, then the gate material 21 is provided in the trenches 20, then an oxide etch removes the silicon dioxide 60 from the trenches 40 and the silicon dioxide 17 from the surface 10a, then the silicon dioxide mask 30 with windows 31 is provided and the semiconductor material 41 is provided in the trenches 40. Also, for example, the source regions 13 may be formed at a later stage than that described with reference to FIGS. 4 and 5. Also, for example, the localised regions 41, 42 could be formed with the trenches 40 before the trench gates 21 are formed with the trenches 20.

Figure 8:
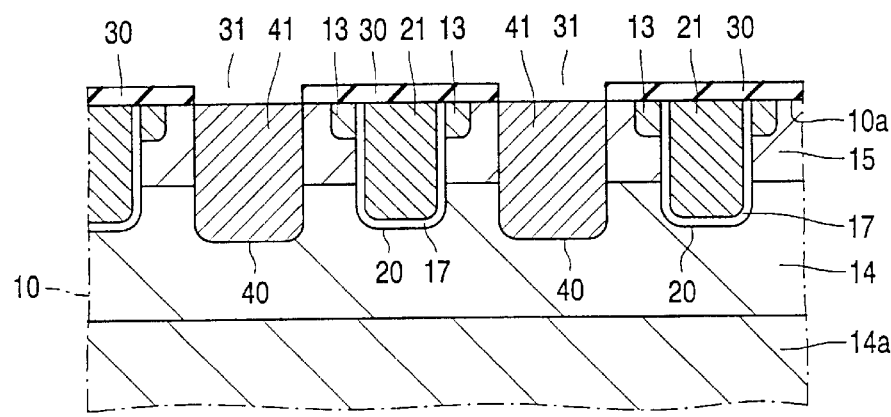
FIG. 8 shows a modification, in accordance with the invention, of the manufacturing stage shown in FIG. 2.

Referring now to FIG. 8, there is shown a modification of the manufacturing stage shown in FIG. 2. In relation to FIG. 2, it was described above how a layer of insulating material 20 with windows 21 is provided on the structure of FIG. 1, how trenches 40 are etched at the windows taking account of variation in trench depth cut across a wafer and how deposited semiconductor material 41 is provided to fill the trenches 40 and dopant from the material 41 is then diffused out of the trenches 40 to provide out-diffused regions 42. The out-diffused region 42 shown in FIG. 2 is preferred in order to provide a well-defined p-n junction between the localised region 41, 42 and the drain region 14. However, it is possible to omit the diffusion step providing the out-diffused region 42 and to provide, as shown in FIG. 8, a p-n junction between a localised region consisting only of the deposited semiconductor material 41 and the drain region 14. In this case, as is shown in FIG. 8, the trenches 40 are etched deeper than as described in relation to FIG. 2 in order to ensure that every trench 40, and hence every region of deposited material 42, extends deeper into the drain region 14 than the surrounding trench-gate trench 20. The game process stage an described above with reference to FIG. 3 is used to proceed from the structure shown in FIG. 8 to a completed device.

Figure 9:
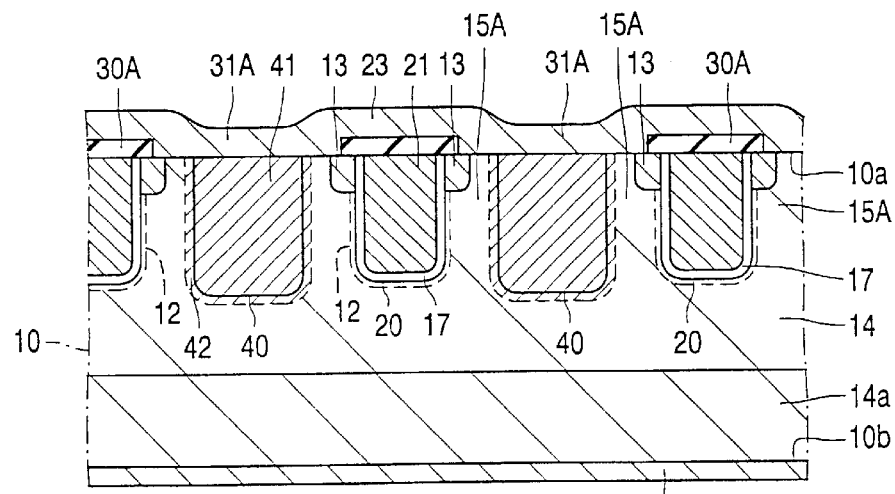
FIG. 9 is a cross-sectional view of the transistor cell areas of an accumulation-mode device (an ACCUFET) in accordance with the invention which can be manufactured by modification of the methods of FIGS. 1 to 8.

Referring now to FIG. 9, there is shown an accumulation-mode device (an ACCUFET) which can be manufactured by the method described with reference to FIGS. 1 to 3, or by the method described with reference to FIGS. 1 to 3 as modified by FIGS. 4 to 7, simply with omission of the p-type layer 15. The device shown in FIG. 9 has a channel-accommodating body region 15A in each transistor cell which is of the same conductivity type (n-type in this example) as the source region 13 and the drain region 14 and is integral with the drain region 14. Alternatively, the (n-type) body region 15A may have a different level of conductivity to the drain region 14 and be provided by a separate process stage. In the device of FIG. 9, the conductive channel 12 induced by the trench-gate 21 in the on-state is formed by charge-carrier accumulation. The function of the localised region 41, 42 in this device is to provide a depletion layer in the body region 15A in the off-state which, together with a depletion layer from the insulated trench-gate 21 may wholly deplete the channel-accommodating body region 15A. This depletion layer in the body region 15A is accurately defined by having the deposited semiconductor material 41 in the trench 40 and, preferably, by having the out-diffused region 42 which extends a uniform distance from the trench 40. In the same manner as for the MOSFET device shown in FIG. 3, the well-defined localised region 41, 42 enables a small transistor cell size so that the ACCUFET device shown in FIG. 9 may also have high cell density and low specific resistance.

Referring now to FIGS. 10 to 12, manufacturing stages are shown which are modified with respect to the stages shown in FIGS. 1 to 3 to produce a MOSFET device with more compact transistor cells than the MOSFET shown in FIG. 3.

FIG. 10 shows a structure similar to that shown in FIG. 1. However, instead of the source regions 13 of FIG. 1 there are continuous n-type regions 13B in the transistor cell areas surrounded by the trench-gate trenches 20 at the top surface 10a of the silicon body 10, and the transistor cell areas are smaller than those shown in FIG. 1. The structure of FIG. 10 may be produced by a modification of the above-described first possible method for producing the structure of FIG. 1. Thus a layered structure 14, 14a, 15 is first provided, and then a network of trenches 20 is formed having a gate insulating layer 17 and gate material 21 in these trenches. A mask 53 is then provided as shown in FIG. 10 to cover the network of trenches 20. The mask 53 could be, for example, silicon dioxide or silicon nitride or resist material. The n-type regions 13B are then formed by implantation of donor ions through the windows in the mask 53 and then diffusion. The mask 53 is then removed. The structure of FIG. 10 may alternatively be produced by a modification of the above-described second possible method for producing the structure of FIG. 1. Thus, after providing a layered structure 14, 14a, 15 a continuous n-type layer is formed across the whole active region of the device by implantation and diffusion into the layer 15, or by epitaxial growth on the layer 15. Using a mask, for example of silicon nitride, the network of trenches 20 is formed through the continuous n-type layer leaving the n-type regions 13B surrounded by the trenches 20 as shown in FIG. 10, and the trenches 20 are then provided with the gate insulating layer 17 and gate material 21.

FIGS. 11 and 12 show fabrication stages starting from the structure of FIG. 10 which are otherwise the same as the stages described above with reference to FIGS. 2 and 3. FIG. 11 shows that the trenches 40 for the localised regions 41, 42 are formed through the n-type regions 13B to define the source regions 13. FIG. 12 also shows that in each transistor cell, the annular source region 13 extends laterally from the surrounding trench-gate trench 20 to the localised region 13.

The compact device shown in FIG. 12 could also be produced by a method incorporating the stages described above with reference to FIGS. 4 to 7 with the modification that, instead of providing the n-type regions 13A shown in FIG. 4, a continuous n-type layer is formed across the whole active region of the device. The modified method described above with reference to FIG. 8 can also be applied to the device of FIG. 12. The device of FIG. 12 could also be modified, as has been described with reference to FIG. 9, to provide an accumulation-mode device.

FIG. 15 illustrates another MOSFET, each cell of which includes the localised region 41 (or 41, 42) that protects the device against turning on of the cell's parasitic bipolar transistor. However, in this modified MOSFET device in accordance with the invention, the drain region 14 comprises an avalanche-breakdown region 64 at the bottom of the trench 40. The inclusion of region 64 renders the device better able to withstand avalanche events, i.e. it renders the MOSFET more rugged. Ruggedness capability is how much energy a MOSFET can absorb without being destroyed. There are two situations, namely "single-shot" and repetitive. Single-shot ruggedness is how much energy the device can handle as a single isolated event. If successive pulses of energy are applied, the device will not be able top handle as much energy per shot as in the single-shot situation; this is repetitive ruggedness capability. The provision of an avalanche-breakdown region 64 in accordance with the invention improves both the single-shot and the repetitive ruggedness.

This avalanche-breakdown region 64 is of the same conductivity type (n-type) as the source and drain regions 13 and 14, but a higher doping concentration (n+) than the adjacent portion (n) of the drain region 14. It forms a p-n junction 65 with the localised region 41 (or 41, 42) at the bottom of the trench 40. Its avalanche breakdown voltage is precisely determined by the donor and acceptor doping concentrations of the regions 64 and 41 (or 41, 42).

Furthermore, the avalanche-breakdown region 64 is located deeper in the drain region 14 than the depth of the trench-gate (first trench 20). This deeper region 64 aids current spreading in the drain region 14 as illustrated by the arrows 66 in FIG. 15. Thus, in the conductive on-state of the MOSFET device, some of the current flowing from the conductive channel 12 into the drain region 14 flows to the region 64. The higher-doped (higher conductive) region 64 then encourages more of the current to flow into the underlying lower-doped portion of the region 14, even below the centre of the trench 40. The location depth of the region 64 is determined by the depth to which the trench is etched in the drain region 14.

FIGS. 13 and 14 show stages in the fabrication of this FIG. 15 device. Thus, before filling the trenches 40 with the p-type material 41, n-type dopant ions (phosporus or arsenic) are implanted in the drain region 14 at the bottom of the trench 40, as illustrated by arrows 60 in FIG. 13. A vertical low-energy implantation is effected, because it is only necessary for the ions 60 to dope the bottom of the trench 40. The implantation damage is easily annealed in the subsequent heating stages, for example in the deposition of the polycrystalline material 41 and/or its subsequent out-diffusion 42. The implanted dopant diffuses slightly during these heating stages. Thus, such a avalanche-breakdown region 64 can be readily incorporated in a device in accordance with the present invention.

In the devices described above the conductive gate 21 is formed of doped polycrystalline silicon. However, other known gate technologies may be used in particular devices. Thus, for example, additional materials may be used for the gate, such as a thin metal layer that forms a silicide with the polycrystalline silicon material. Alternatively, the whole gate 21 may be of a metal instead of polycrystalline silicon. FIGS. 1 to 15 illustrate the preferred situation of an insulated gate structure, in which the conductive gate 21 is capacitively coupled to the channel-accommodating body region 15 (or 15A) by an insulating dielectric layer 17. However, so-called Schottky gate technologies may alternatively be used. In this case, a gate insulating dielectric layer 17 is absent and the conductive gate 21 is of a metal that forms a Schottky barrier with the low-doped channel-accommodating body region 15 (or 15A). The Schottky gate 21 is capacitively coupled to the channel-accommodating region 15 (or 15A) by the depletion layer present at the Schottky barrier.

The particular examples described above are n-channel devices, in which the regions 13 and 14 are of n-type conductivity, and an electron inversion channel 12 is induced in the region 15 (or 15A) by the gate 21. By using opposite conductivity type dopants, a p-channel device can be manufactured by methods in accordance with the invention. In this case, the regions 13 and 14 are of p-type conductivity, a hole inversion channel 12 is induced by the gate 21, and the localised regions 41, 42 are n-type.

A vertical discrete device has been illustrated with reference to FIGS. 1 to 15, having its second main electrode 24 contacting the region 14a at the back surface 10b of the body 10. However, an integrated device is also possible in accordance with the invention. In this case, the region 14a may be a doped buried layer between a device substrate and the expitaxial low-doped drain region 14. This buried layer region 14a may be contacted by an electrode 24 at the front major surface 10a, via a doped peripheral contact region which extends from the surface 10a to the depth of the buried layer.

From reading the present disclosure, other variations and modifications will be apparent to persons skilled in the art. Such variations and modifications may involve equivalent and other features which are already known in the art and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A trench-gate semiconductor device comprising a semiconductor body having a plurality of transistor cells, wherein each transistor cell is surrounded by a trench-gate comprising a first trench extending into the semiconductor body with gate material in the trench, an insulating overlayer on top of the gate material, a source region of a first conductivity type adjacent to the trench-gate, a channel-accommodating body region adjacent to the trench-gate under the source region, and a drain region of the first conductivity type adjacent to the trench-gate under the channel-accommodating body region, wherein at least some of the transistor cells have a localised region of a second conductivity type, opposite to the first conductivity type, which is of higher conductivity than the channel-accommodating region, the localised region extending into the semiconductor body to the drain region and being separated from the trench-gate first trench by the channel-accommodating body region, wherein a source electrode extends over said insulating overlayer and contacts the source region and the localised region, and wherein the device is characterised in that each said localised region comprises deposited semiconductor material of the second conductivity type which fills a second trench extending into the semiconductor body, with the source electrode contacting said localised region on the whole top area of the second trench.

2. A device as claimed in claim 1, wherein every one of said plurality of transistor cells has a said localised region.

3. A device as claimed in claim 1, wherein there is an insulating layer in each said first trench between the gate material in the first trench and the semiconductor body adjacent the first trench.

4. A device as claimed in claim 1, wherein the channel accommodating body region in each transistor cell is of the second conductivity type.

5. A device as claim in claim 1, wherein the channel accommodating body region in each transistor cell is of the first conductivity type.

6. A device as claimed in claim 5, wherein the channel-accommodating body region in each transistor cell is integral with said drain region.

7. A device as claimed in claim 1, wherein in each transistor cell having a said localised region, said source region extends laterally from said first trench to adjacent said localised region.

8. A device as claimed in claim 1, wherein said deposited semiconductor material of each said localised region is doped polycrystalline silicon of said second conductivity type.

9. A device as claimed in claim 8, wherein said gate material in said first trench of each transistor cell is doped polycrystalline silicon of said first conductivity type.

10. A device as claimed in claim 1, wherein each said second trench extends deeper into the drain region than the first trench surrounding that second trench.

11. A device as claimed in claim 1, wherein each said second trench extends the same depth into the drain region as the first trench surrounding that second trench.

12. A device as claimed in claim 1, wherein each said localised region includes an out-diffused region extending from the side and bottom of the respective second trench, the out-diffused region having a diffusion profile of dopant from the deposited semiconductor material which fills the respective second trench.

13. A device as claimed in claim 1, wherein the drain region comprises an avalanche-breakdown region of the first conductivity type that forms a p-n junction with the localised region at the bottom of the second trench and that has a higher doping concentration than the adjacent portion of the drain region so as to determine an avalanche breakdown voltage for the p-n junction.

14. A device as claimed in claim 13, wherein the location of the avalanche-breakdown region is deeper in the drain region than the depth of the first trench that provides the trench-gate so as to aid current spreading in the drain region.

* * * * *